(12) United States Patent
Kitano et al.

(10) Patent No.: US 6,620,248 B2
(45) Date of Patent: Sep. 16, 2003

(54) COATING APPARATUS AND MIXING APPARATUS

(75) Inventors: Takahiro Kitano, Kikuchi-Gun (JP); Yuji Matsuyama, Kikuchi-Gun (JP); Junichi Kitano, Nirasaki (JP); Hiroyuki Hara, Kikuchi-Gun (JP)

(73) Assignee: Toyko Electron Limited, Tokyo-to (JP)

( * ) Notice: Subject to any disclaimer, the term of this patent is extended or adjusted under 35 U.S.C. 154(b) by 0 days.

(21) Appl. No.: 09/820,938

(22) Filed: Mar. 30, 2001

(65) Prior Publication Data

US 2002/0000193 A1 Jan. 3, 2002

(30) Foreign Application Priority Data

Mar. 31, 2000 (JP) .......................................... 2000-097016

(51) Int. Cl.[7] ................................................ B05C 11/10
(52) U.S. Cl. .................... 118/690; 118/91; 118/692; 118/689
(58) Field of Search ............... 118/689, 690, 118/691, 692, 612, 319, 320; 138/155; 285/133.11, 133.6

(56) References Cited

U.S. PATENT DOCUMENTS

| | | | |
|---|---|---|---|
| 4,514,244 A | * | 4/1985 | Shaefer et al. ............... 156/158 |
| 4,699,081 A | * | 10/1987 | Mack ........................... 118/691 |
| 4,738,219 A | | 4/1988 | Fujisawa |
| 5,854,953 A | | 12/1998 | Semba |
| 5,968,268 A | * | 10/1999 | Kitano et al. ................ 118/320 |

* cited by examiner

Primary Examiner—Richard Crispino
Assistant Examiner—George R. Koch, III
(74) Attorney, Agent, or Firm—Oblon, Spivak, McClelland, Maier & Neustadt, P.C.

(57) ABSTRACT

In a coating apparatus for supplying a mixed solution of a resist solution and a thinner onto a wafer from a nozzle, the nozzle is connected to a mixed solution supply pipe, and the resist solution and the thinner are supplied to the mixed solution supply pipe from a resist solution supply pipe and a thinner supply pipe respectively through a junction pipe. The diameter of the junction pipe is set smaller than those of other supply pipes, whereby the resist solution and the thinner can be mixed efficiently in the junction pipe, and as a result the wafer is coated with the mixed solution so that a uniform film thickness can be obtained within the surface of the wafer.

11 Claims, 11 Drawing Sheets

COATING APPARATUS AND MIXING APPARATUS

BACKGROUND OF THE INVENTION

1. Field of the Invention

The present invention relates to a coating apparatus for coating a substrate to be processed such as a semiconductor wafer or the like with a solution such as a resist solution, a developing solution, or the like and a mixing apparatus.

2. Description of the Related Art

In a photolithography process of the process of fabricating a semiconductor device, for example, resist coating processing of forming a resist film on the surface of a semiconductor wafer (hereinafter referred to as "a wafer") and developing processing for the resist-coated wafer are performed with exposure processing therebetween.

If notice is taken of the resist coating processing, a spin coating method or the like is frequently used as a method for uniformly coating the surface of the wafer with a resist solution. Resist coating by means of this spin coating method is performed as follows: the wafer is rotated while being vacuum-sucked by a spin chuck; the resist solution is dropped and supplied to the surface of the wafer from directly above the center of the rotation; and the resist solution is spread over the entire surface from the center of the wafer by centrifugal force. In a resist coating apparatus of this type, the thickness of a resist film can be controlled by the rotation speed of the spin chuck (wafer). Namely, with an increase in rotation speed, a thinner resist film can be obtained.

However, from the limits of the performance of the coating apparatus itself (the rotation speed of the spin chuck), a minimum value of a formable resist film thickness is restricted by itself. Therefore, whenever the thickness of a resist film is changed, resist solutions different in viscosity need to be prepared.

In order to cope with the aforesaid situation, an art in which a resist solution with a desired viscosity is supplied onto a wafer by controlling the mixing ratio of a resist solution to a thinner is described in Japanese Patent Laid-open No. Hei 10-242045 and Japanese Patent Laid-open No. Hei 10-272407.

In such a resist coating apparatus, however, the resist solution and the thinner have no compatibility, and hence mixing is insufficient in some cases. When the wafer is coated with a mixed solution in such an insufficient mixing state, ununiformity of resist film thickness within the surface of the wafer sometimes occurs.

SUMMARY OF THE INVENTION

An object of the present invention is to provide a coating apparatus for uniformly coating the surface of a substrate with a solution such as a resist solution which is applied to the substrate, and a mixing apparatus.

A coating apparatus of the present invention comprises: a holder for holding a substrate; a nozzle for supplying a mixed solution of a processing solution and a solvent to a surface of the substrate; a first pipe having a first inside diameter, for supplying the mixed solution to the nozzle; a second pipe having a second inside diameter, for supplying the processing solution to the first pipe; a third pipe having a third inside diameter, for supplying the solvent to the first pipe; a fourth pipe which has a fourth inside diameter smaller than all of the first inside diameter, the second inside diameter, and the third inside diameter, which is connected to the first pipe, the second pipe, and the third pipe, to which the processing solution and the solvent are supplied, and which supplies the mixed solution of the processing solution and the solvent to the first pipe.

A mixing apparatus of the present invention comprises: a first pipe having a first inside diameter, for discharging a mixed solution of a processing solution and a solvent; a second pipe having a second inside diameter, for supplying the processing solution to the first pipe; a third pipe having a third inside diameter, for supplying the solvent to the first pipe; a fourth pipe which has a fourth inside diameter smaller than all of the first inside diameter, the second inside diameter, and the third inside diameter, which is connected to the first pipe, the second pipe, and the third pipe, to which the processing solution and the solvent are supplied, and which supplies the mixed solution of the processing solution and the solvent to the first pipe.

According to the aforesaid structures of the present invention, the inside diameter of the junction pipe, for example, which is the fourth pipe is set to be smaller than the inside diameters of the other pipes, whereby the processing solution and the solvent can be mixed efficiently in the junction pipe. As a result, the mixed solution of the processing solution and the solvent to be supplied onto the substrate is mixed sufficiently, and hence the substrate can be coated with the mixed solution so that a uniform film thickness can be obtained within the surface of the substrate.

These objects and still other objects and advantages of the present invention will become apparent upon reading the following specification when taken in conjunction with the accompanying drawings.

DETAILED DESCRIPTION OF THE PREFERRED EMBODIMENT

Embodiments of the present invention will be explained below with reference to the drawings.

Figure 1:
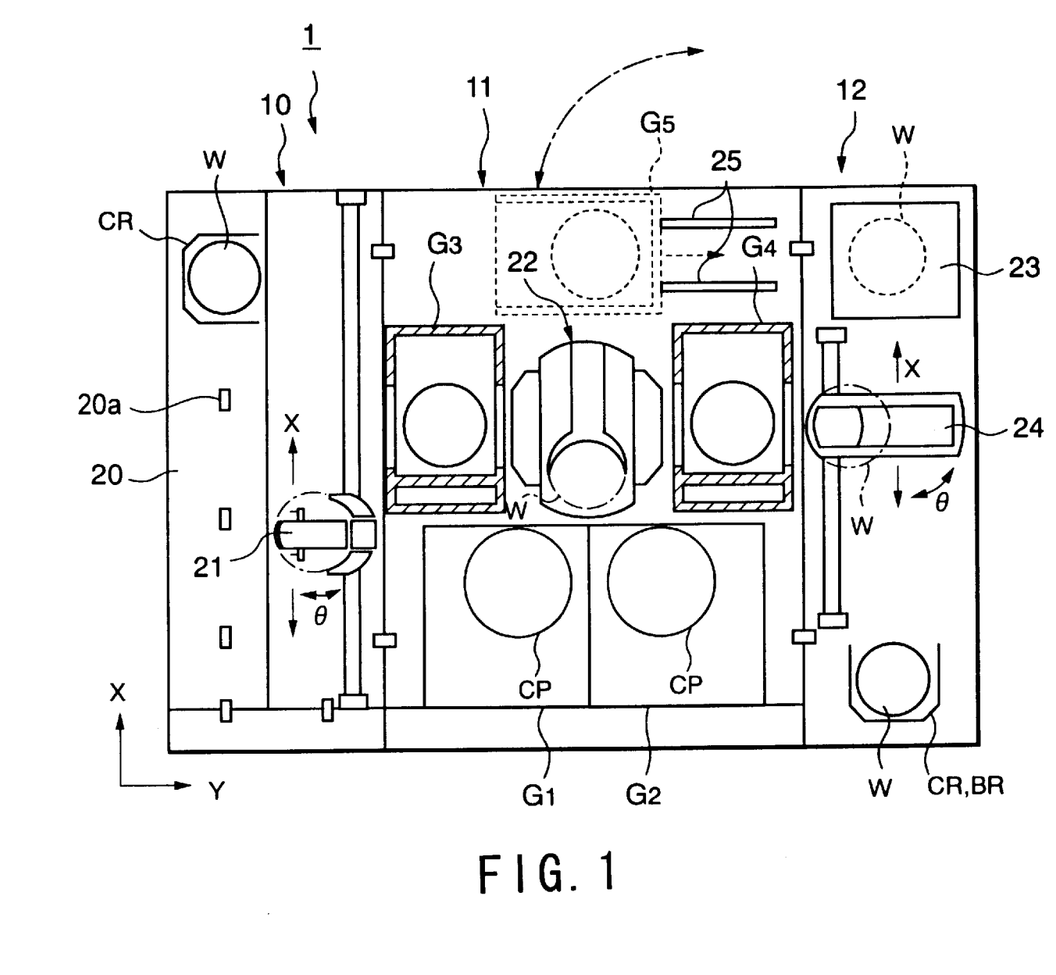
FIG. 1 is a plan view showing the entire structure of a coating and developing processing system of a semiconductor wafer according to an embodiment of the present invention.
Figure 2:
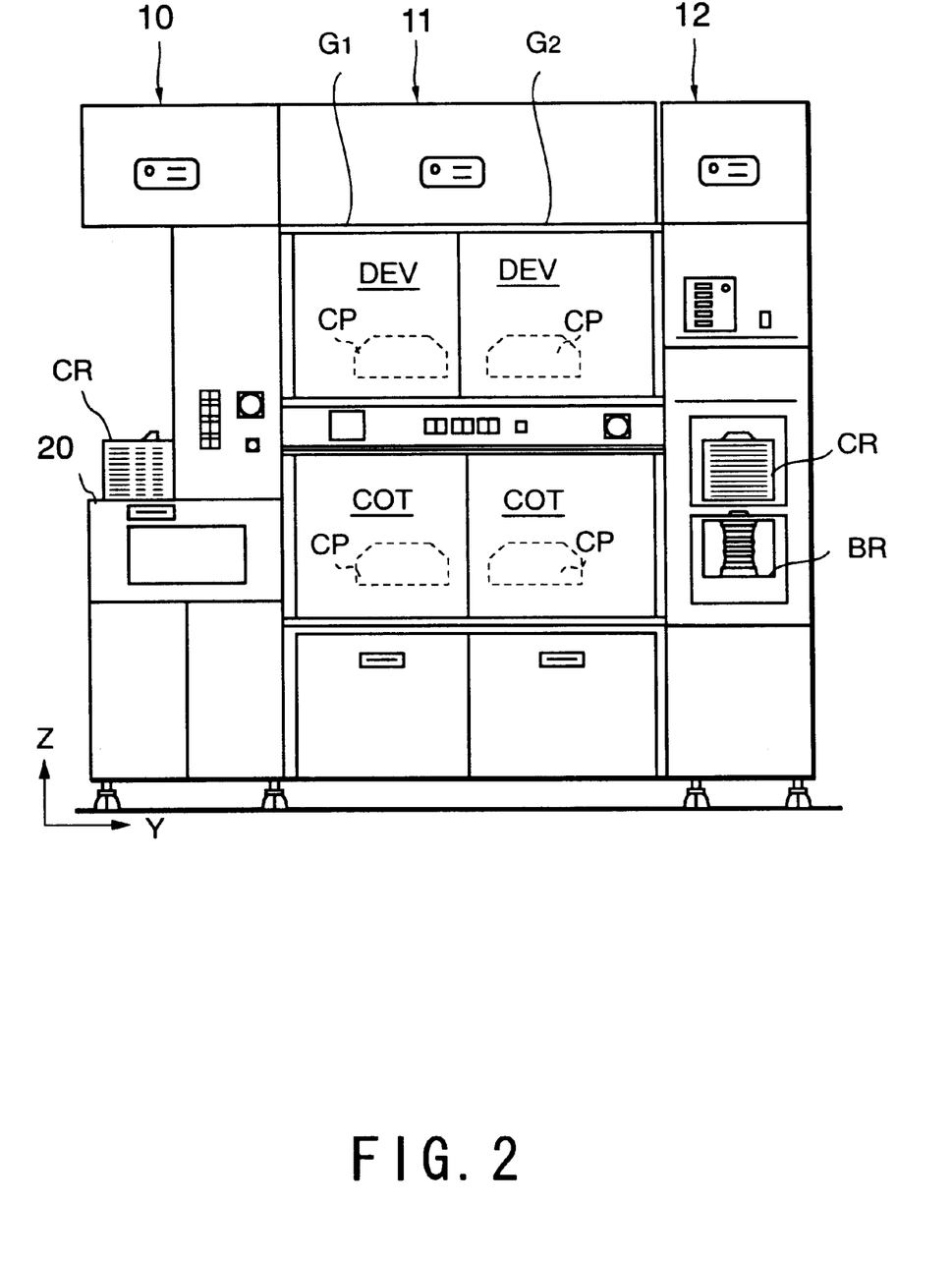
FIG. 2 is a front view showing the structure of the coating and developing processing system in FIG. 1.
Figure 3:
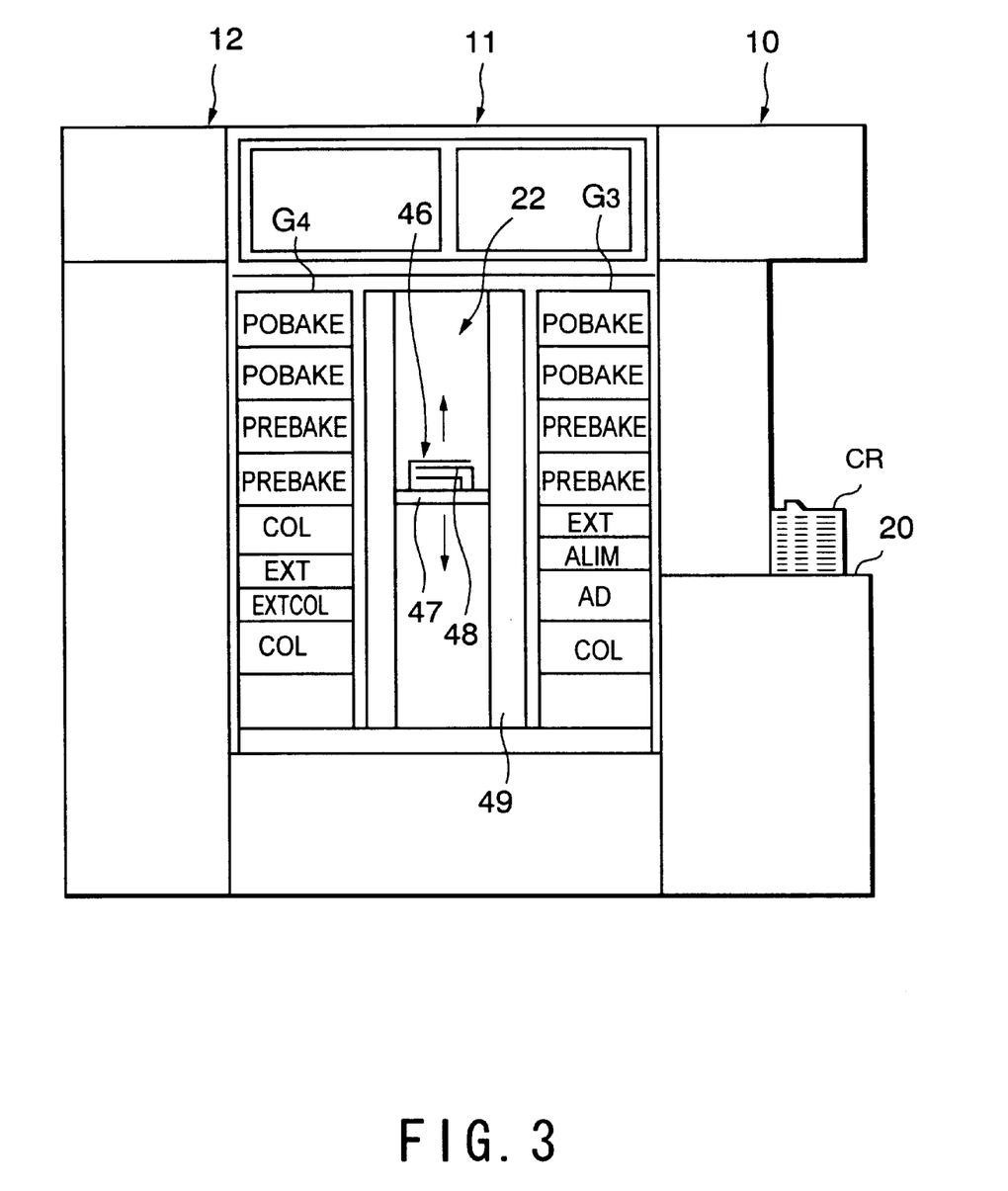
FIG. 3 is a rear view showing the structure of the coating and developing processing system in FIG. 1.

FIG. 1 to FIG. 3 are diagrams showing the entire structure of a coating and developing processing system 1 of a semiconductor wafer (hereinafter referred to as "a wafer") in which a resist coating unit, an embodiment of the present invention, is used. FIG. 1 is a plan view, FIG. 2 is a front view, and FIG. 3 is a rear view.

This coating and developing processing system 1 has a structure in which a cassette station 10 for transferring a plurality of, for example, 25 wafers W as substrates to be processed per wafer cassette CR, as a unit, from/to the outside into/from the system or carrying the wafer W into/out of the wafer cassette CR, a processing station 11 in which various kinds of processing units which perform predetermined processing for the wafers W one by one in a coating and developing process are stacked in multiple tiers at predetermined positions, and an interface unit 12 for receiving and sending the wafer W from/to an aligner (not illustrated) provided adjacent to the processing station 11 are integrally connected.

In the cassette station 10, as shown in FIG. 1, a plurality of, for example, up to four wafer cassettes CR are mounted in a line in an X-direction (in a top-to-bottom direction in FIG. 1) at the positions of positioning projections 20a on a cassette mounting table 20 with respective wafer transfer ports facing the processing station 11 side. A wafer carrier 21 movable in the direction of arrangement of the cassettes (the X-direction) and in the direction of arrangement of the wafers housed in the cassette CR (a Z-direction, i.e., a vertical direction) selectively gets access to each of the wafer cassettes CR.

The wafer carrier 21 is also structured to be rotatable in a θ-direction so as to be able to get access to an alignment unit (ALIM) and an extension unit (EXT) included in units staked in multiple tiers of a third processing unit group G3 on the processing station 11 side as will be described later.

In the processing station 11, as shown in FIG. 1, a vertical-transfer type main wafer transfer mechanism 22 provided with a wafer transfer device is disposed, and around the main wafer transfer mechanism 22, all processing units are stacked in multiple tiers to compose one or a plurality of groups.

As shown in FIG. 3, the main wafer transfer mechanism 22 is provided with a wafer transfer device 46 which is freely ascendable and descendable vertically (in the Z-direction) inside a cylindrical supporter 49. The cylindrical supporter 49 is connected to a rotating shaft of a motor (not illustrated) and rotated around the rotating shaft integrally with the wafer transfer device 46 by rotational driving force of the motor. Therefore, the wafer transfer device 46 is freely rotatable in the θ-direction. Incidentally, the cylindrical supporter 49 may be structured to connect with another rotating shaft (not illustrated) which is rotated by the aforesaid motor.

The wafer transfer device 46 has a plurality of holders 48 which are movable in the forward and backward directions of a transfer base 47, and realizes the delivery of the wafer W between the respective processing units by using these holders 48.

In this example, five processing unit groups G1, G2, G3, G4, and G5 can be disposed. Units staked in multiple tiers of the first and second processing unit groups G1 and G2 are disposed on the front side of this system (the lower side in FIG. 1). Units staked in multiple tiers of the third processing unit group G3 are disposed adjacent to the cassette station 10. Units staked in multiple tiers of the fourth processing unit group G4 are disposed adjacent to the interface unit 12. Units staked in multiple tiers of the fifth processing unit group G5 can be disposed on the rear side.

As shown in FIG. 2, in the first processing unit group G1, two spinner-type processing units each of which performs predetermined processing while the wafer W is mounted on a spin chuck within a cup CP, for example, a resist coating unit (COT) and a developing processing unit (DEV) are stacked in two tiers from the bottom in order. Also in the second processing unit group G2, two spinner-type processing units, for example, a resist coating unit (COT) and a developing processing unit (DEV) are stacked in two tiers from the bottom in order. It is preferable to dispose these resist coating units (COT) at the lower tier since the drainage of a resist solution is troublesome in terms of both mechanism and maintenance, but it is naturally possible to dispose them at the upper tier appropriately as required.

As shown in FIG. 3, in the third processing unit group G3, oven-type processing units each of which performs predetermined processing while the wafer W is mounted on a mounting table SP, for example, a cooling unit (COL) which performs cooling processing, an adhesion unit (AD) which performs so-called hydrophobic processing for enhancing adhesion of a resist, an alignment unit (ALIM) which aligns the wafer W, an extension unit (EXT), pre-baking units (PREBAKE) each of which performs baking processing before exposure processing, and post-baking units (POBAKE) each of which performs baking processing after exposure processing are stacked in eight tiers from the bottom in order. Also in the fourth processing unit group G4, oven-type processing units, for example, a cooling unit (COL), an extension and cooling unit (EXTCOL), an extension unit (EXT), a cooling unit (COL), pre-baking units (PREBAKE), and post-baking units (POBAKE) are stacked in eight tiers from the bottom in order.

The aforesaid arrangement of the cooling unit (COL) and the extension and cooling unit (EXTCOL) each having a low processing temperature at the lower tiers and the pre-baking unit (PREBAKE), the post-baking unit (POBAKE), and the adhesion unit (AD) each having a high processing temperature at the upper tiers can reduce thermal mutual interference between units. Random arrangement in multiple tiers is naturally suitable.

The interface unit 12 is set at the same size as the processing station 11 in a depth direction (the X-direction), but at a smaller size than that in a width direction. A transportable pickup cassette CR and a fixed-type buffer cassette BR are stacked in two tiers at the front of the interface unit 12, a peripheral edge aligner 23 is disposed at the rear thereof, and a wafer carrier 24 is provided at the center thereof. This wafer carrier 24 moves in the X-direction and the Z-direction to get access to both the cassettes CR and BR, and the peripheral edge aligner 23. The wafer carrier 24 is also structured to be rotatable in the θ-direction to be able to get access to the extension unit (EXT) included in the units stacked in multiple tiers of the fourth processing unit group G4 on the processing station 11 side and a wafer delivery table (not illustrated) on the adjoining aligner side.

Moreover, in the coating and developing processing system 1, as described above, units stacked in multiple tiers of the fifth processing unit group G5 shown by a broken line can be provided on the rear side of the main wafer transfer mechanism 22. The units stacked in multiple tiers of the fifth processing unit group G5 can shift along guide rails 25 sideways as seen from the main wafer transfer mechanism 22. Accordingly, even when the units stacked in multiple tiers of the fifth processing section G5 are provided as illustrated, a space is secured by sliding them along the guide rails 25, so that maintenance operations for the main wafer transfer mechanism 22 can be easily performed from the back thereof. Incidentally, as for the units stacked in multiple tiers of the fifth processing unit group G5, a space for the maintenance operations for the main wafer transfer mechanism 22 can be secured easily not only by such linear sliding sift along the guide rails 25 but also by rotational shift to the outside of the system as indicated by the reciprocating rotational motion arrow shown by a chain line in FIG. 1.

Figure 4:
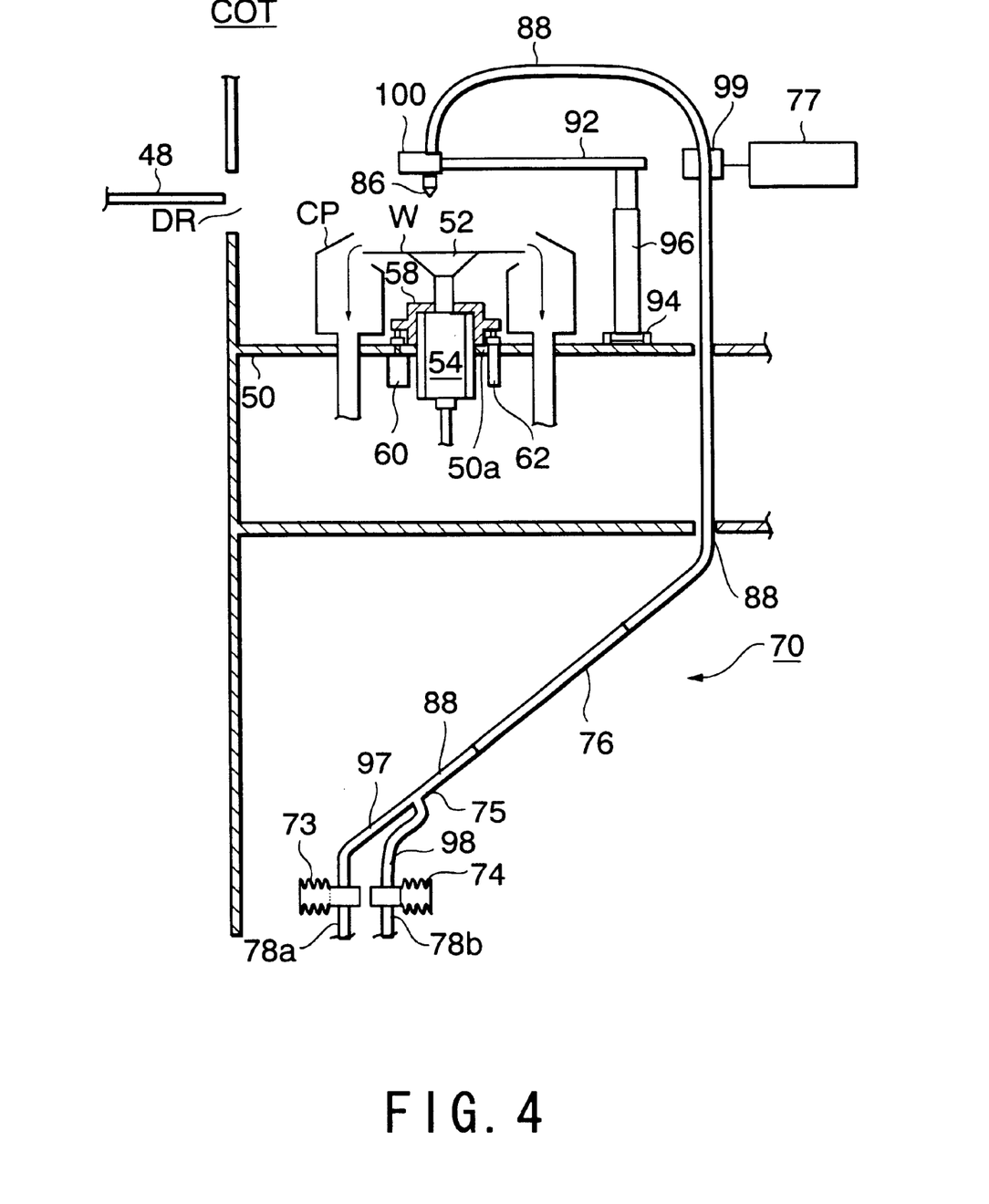
FIG. 4 is a sectional view showing the entire structure of a resist coating unit in the coating and developing processing system in FIG. 1.
Figure 5:
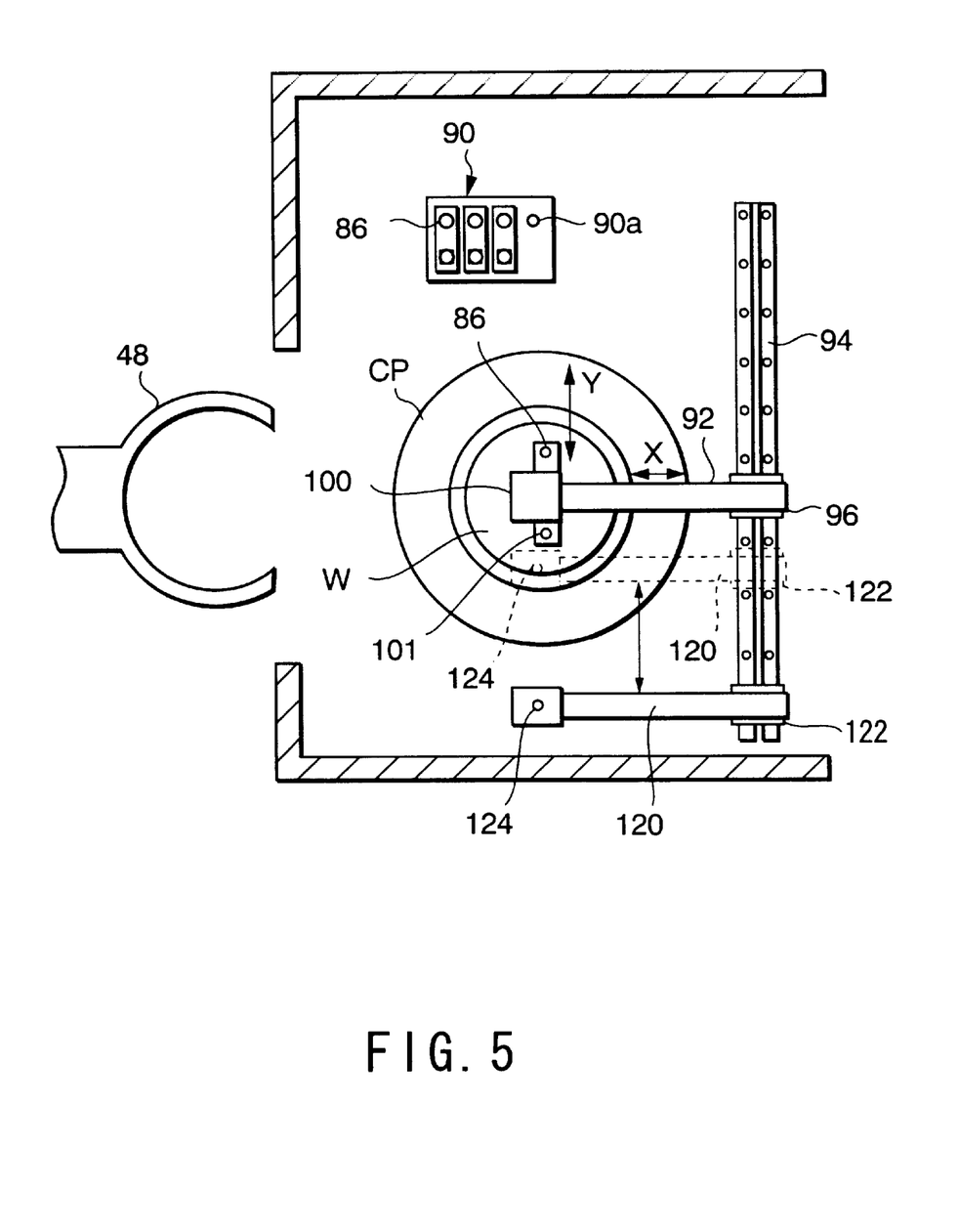
FIG. 5 is a plan view showing the entire structure of the resist coating unit in FIG. 4.

Next, the resist coating unit (COT) in this embodiment will be explained. FIG. 4 and FIG. 5 are a schematic sectional view and a schematic plan view showing the entire structure of the resist coating unit (COT).

An annular cup CP is provided in the middle of the resist coating unit (COT), and a spin chuck 52 is placed inside the cup CP. The spin chuck 52 is rotationally driven by a drive motor 54 while fixedly holding the wafer W by vacuum suction. The drive motor 54 is placed so as to be ascendable and descendable through an opening 50a provided in a unit base plate 50, and coupled to a raising and lowering drive 60 and a raising and lowering guide 62, for example, composed of air cylinders, for example, via a cap-shaped flange 58, for example, made of aluminum.

A mixed solution nozzle 86 for supplying a mixed solution of a resist solution as a processing solution and a thinner as a solvent to the surface of the wafer W is removably attached to the tip of a mixed solution nozzle scan arm 92 with a nozzle holder 100 therebetween. This mixed solution nozzle scan arm 92 is attached to the upper end of a vertical support 96 which is horizontally movable on guide rails 94 laid in one direction (the Y-direction) on the unit base plate 50, and moves in the Y-direction integrally with the vertical support 96 by a Y-direction drive mechanism not illustrated.

The mixed solution nozzle scan arm 92 is also movable in the X-direction perpendicular to the Y-direction in order to selectively attach the mixed solution nozzle 86 thereto at a mixed solution nozzle waiting position 90, and moves in the X-direction by an X-direction drive mechanism not illustrated. At the mixed solution nozzle waiting position 90, a discharge port of the mixed solution nozzle 86 is inserted into a hole 90a of a solvent atmosphere chamber and exposed to a solvent atmosphere therein, whereby the mixed solution at the tip of the nozzle does not solidify nor deteriorate. Moreover, a plurality of mixed solution nozzles 86, 86, . . . are provided, and a suitable nozzle is chosen out of these according to the type and viscosity of the resist solution.

Moreover, a thinner nozzle 101 for supplying a thinner, for example, to the surface of the wafer before the supply of the resist solution to the surface of the wafer is attached to the tip (the nozzle holder 100) of the mixed solution nozzle scan arm 92.

A vertical support 122 which supports a rinse nozzle scan arm 120 and is movable in the Y-direction, as well as the vertical support 96 which supports the mixed solution nozzle scan arm 92, is provided on the guide rails 94. A rinse nozzle 124 for side rinse is attached to the tip of this rinse nozzle scan arm 120. The rinse nozzle scan arm 120 and the rinse nozzle 124 are moved translationally or linearly between a rinse nozzle waiting position (a position shown by a full line) which is set by the side of the cup CP and a rinse solution discharge position (a position shown by a dotted line) which is set directly above the periphery of the wafer W placed on the spin chuck 52.

The mixed solution nozzle 86 is connected to a resist/thinner mixer 70 provided inside a lower chamber of the resist coating unit (COT) via a mixed solution supply pipe 88.

Figure 6:
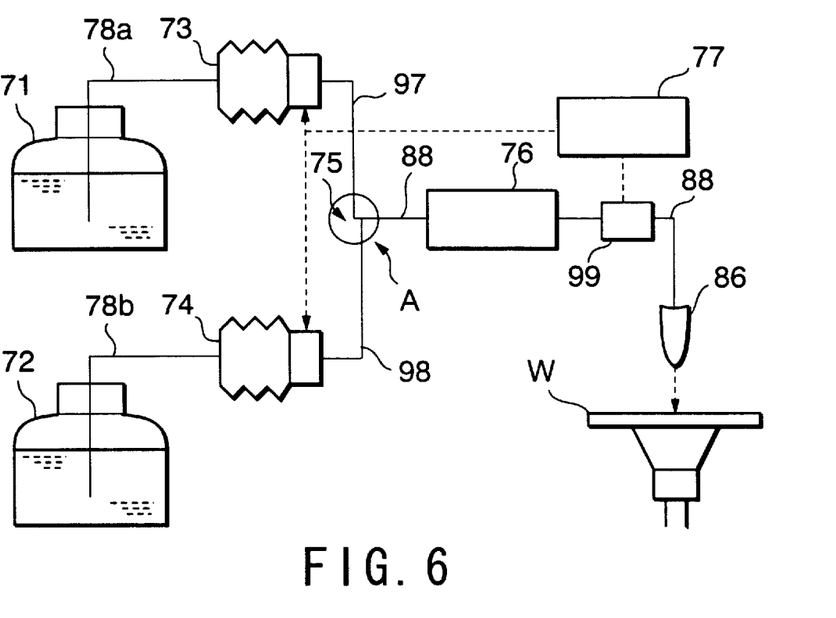
FIG. 6 is a diagram showing the structure of a resist/thinner mixer in the resist coating unit in FIG. 4.

Now, the details of the resist/thinner mixer will be given. As shown in FIGS. 4 and 6, the resist/thinner mixer 70 includes a resist tank 71 for storing a resist solution, a thinner tank for storing, for example, a thinner as a solvent, the mixed solution supply pipe 88 for supplying a mixed solution of the resist solution and the thinner to the mixed solution nozzle 86, a resist solution supply pipe 97 for supplying the resist solution to the mixed solution supply pipe 88, a thinner supply pipe 98 which is a solvent supply pipe for supplying the thinner to the mixed solution supply pipe 88, a junction pipe 75, which is located at the junction of the resist solution supply pipe 97 and the thinner supply pipe 98, for mixing the resist solution and the thinner and supplying this mixed solution to the mixed solution supply pipe 88, a resist bellows pump 73 for sucking up the resist solution in the resist tank 71 and introducing it into the resist solution supply pipe 97, a thinner bellows pump 74 for sucking up the thinner in the thinner tank 72 and introducing it into the thinner supply pipe 98, and a static mixer 76 for stirring and mixing again the mixed solution of the resist solution and the thinner which has passed the junction pipe 75. It further includes a sensor 99 which measures the concentration of the mixed solution passing the mixed solution supply pipe 88, and a controller 77 which performs such control that the concentration of the mixed solution reaches a predetermined concentration. The sensor 99 can measure the concentration of the mixed solution, for example, by irradiating a light with a wavelength, to which the resist is not exposed, to the mixed solution and analyzing the transmitted light. The aforesaid pipes such as the respective supply pipes and the junction pipe are formed, for example, out of Teflon tubes excellent in corrosion resistance. The junction pipe is a pipe corresponding to the junction of the resist solution and the thinner, and it is required that the inside diameter of the pipe at this junction is smaller than those of the other pipes such as the mixed solution supply pipe, the resist solution supply pipe, and the thinner supply pipe. Moreover, these pipes, for example, the junction pipe, the mixed solution supply pipe, the resist solution supply pipe, and the thinner supply pipe can be manufactured by separately preparing these pipes and welding them together.

The resist tank 71 and the thinner tank 72 are provided outside the coating and developing processing system 1 and connected to the resist solution bellows pump 73 and the solvent bellows pump 74 via pipes 78a and 78b which lead to the inside and outside of the system.

Figure 10A:
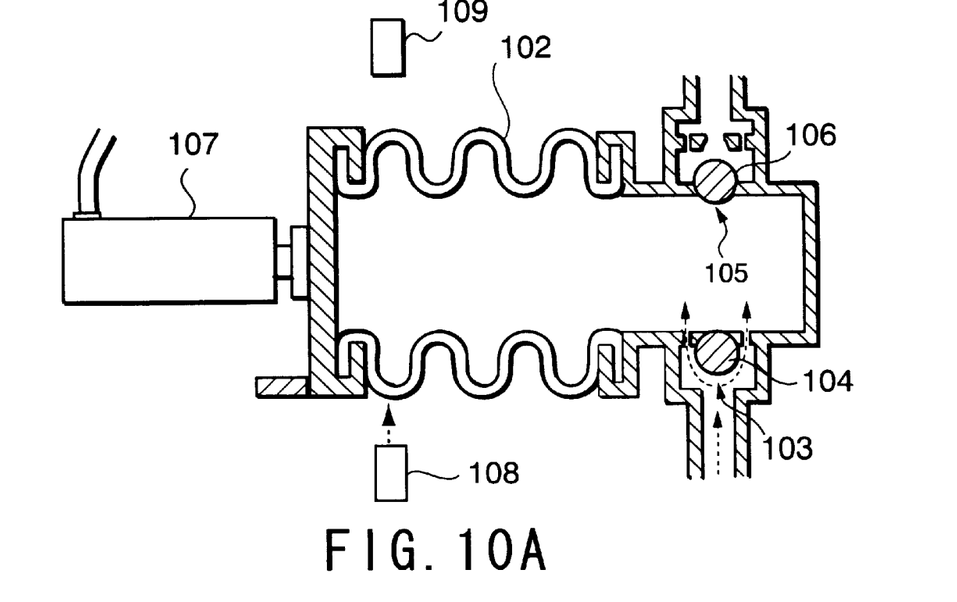
FIG. 10A and FIG. 10B are diagrams each showing the operation timing of a bellows pump and valves in FIG. 6.
Figure 10B:
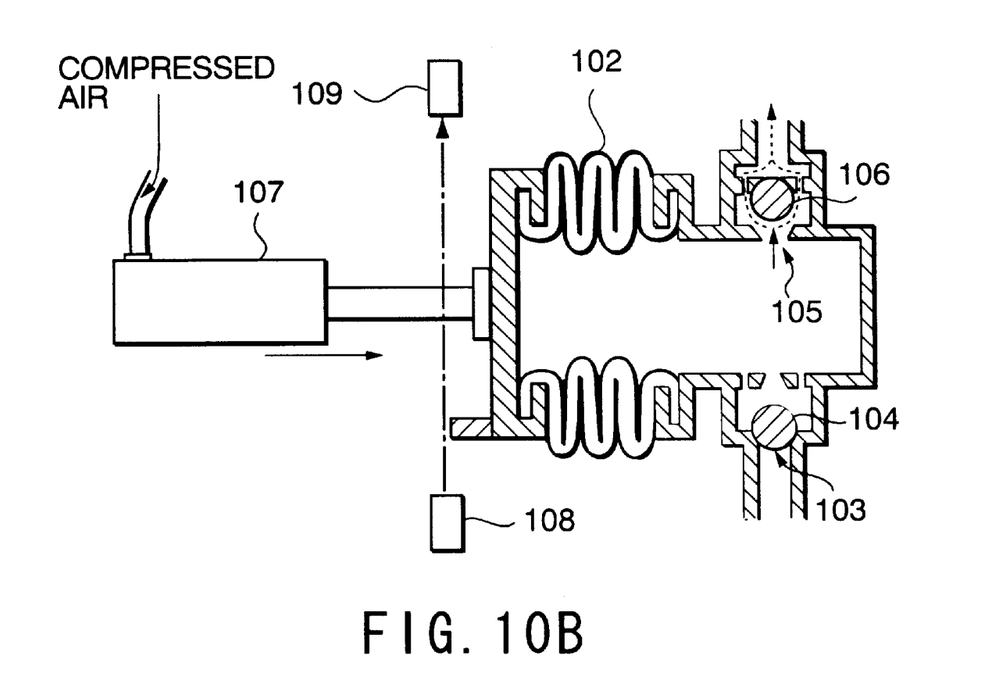

The bellows pumps 73 and 74 suck up and the resist solution and the solvent from the tanks 71 and 72 respectively and discharge them by the extension and contraction motion of each bellows-shaped extensible and contractible flexible tube. As shown in FIG. 10A, for example, in an extension process of a flexible tube 102, a sphere 104 for opening and closing a suction port 103 of each pump is drawn in such a direction that the suction port 103 is opened, and simultaneously a sphere 106 for opening and closing a discharge port 105 of each pump is drawn in such a direction that the discharge port 105 is closed, whereby the resist solution and the thinner to the amount corresponding to the extension and contraction stroke of the flexible tube 102 in the respective pumps are sucked up. Contrary to this, in a compression process of the flexible tube 102, as shown in FIG. 10B, the sphere 104 is drawn in such a direction that the suction port 103 is closed, and simultaneously the sphere 106 is drawn in such a direction that the discharge port 105 is opened, whereby the resist solution and the thinner in the respective pumps are discharged. A chuck valve is structured as described above.

The flexible tube 102 is driven to advance or retreat by an air cylinder 107, and can regulate each of supply amounts of the resist solution and the thinner by mechanically limiting a movable range of a piston inside the cylinder through the use of a limiter. In the vicinity of each of the bellows pumps 73 and 74, a light transmission sensor, composed of a light-emitting element 108 and a light-receiving element 109, for detecting the arrival of the flexible tube 102 at an end point of the compression process (discharge process) and outputting a detection signal thereof to the controller is disposed at a fixed position.

Figure 7:
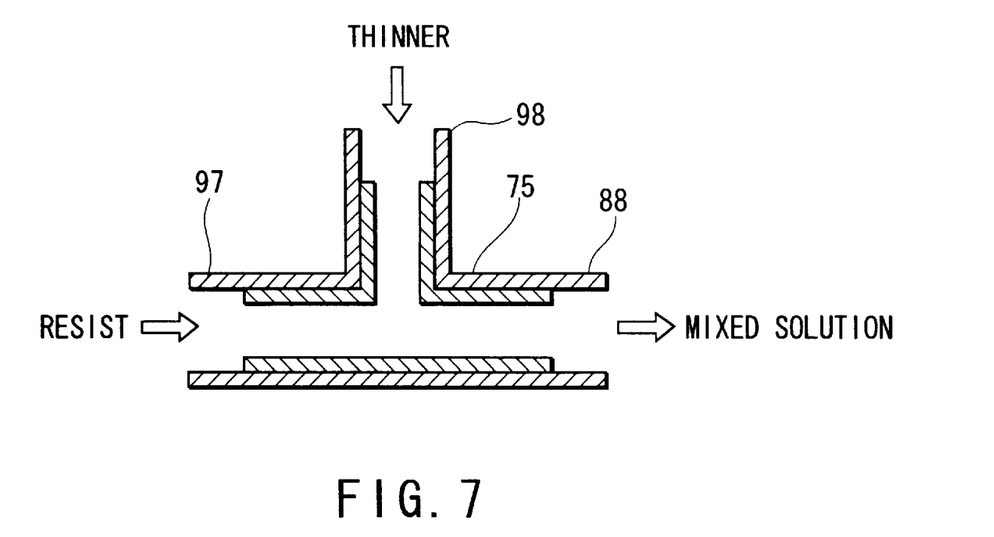
FIG. 7 is a schematic enlarged view of a region in the circle A in FIG. 6, which is a sectional view showing a junction pipe.

As shown in FIG. 6, the junction pipe 75 is connected to the mixed solution supply pipe 88, the resist solution supply pipe 97, and the thinner supply pipe 98. FIG. 7 is an enlarged view of the circle A in FIG. 6 for explaining the inside diameters of the respective pipes.

The mixed solution supply pipe 88 is cylindrical, for example, with an inside diameter of 6 mm. The resist solution supply pipe 97 is cylindrical, for example, with an inside diameter of 6 mm. The thinner supply pipe 98 is cylindrical, for example, with an inside diameter of 6 mm. The junction pipe 75 is set to have a cylindrical shape with an inside diameter of 0.2 mm to 0.5 mm, and more preferably 0.4 mm to 0.5 mm, and as shown in FIG. 7, its inside diameter is smaller than those of the mixed solution supply pipe 88, the resist solution supply pipe 97, and the thinner supply pipe 98. Accordingly, the thinner and the resist solution which flow into the junction pipe 75 are mixed in the junction pipe 75 and flow out to the mixed solution supply pipe 88. Incidentally, if the inside diameter of the junction pipe 75 is smaller than 0.2 mm, a pressure loss on the pump side becomes very large, and if the inside diameter of the junction pipe 75 is larger than 0.5 mm, the effects produced by mixing the thinner and the resist solution in the junction pipe 75 can not be expected. Moreover, especially in this embodiment, the resist solution supply pipe 97, the junction pipe 75, and the mixed solution supply pipe 88 are connected in a straight line, and the thinner supply pipe 98 is orthogonally connected to the junction pipe 75. Since the ratio of the resist solution to the thinner to be supplied to the mixed solution supply pipe 88 is about three to one, the aforesaid connection enables smooth supply of the mixed solution without putting too much of a burden on each of the pumps.

The mixed solution which has flowed out to the mixed solution supply pipe 88 is mixed again in a static mixer 76, and supplied to the mixed solution supply nozzle 86 through the mixed solution supply pipe 88. Since the resist solution and the thinner are mixed in advance prior to mixing by the static mixer 76, it is possible to shorten the length of the static mixer 76 which will be described later and thereby downsize the entire unit. A mixing degree of the resist solution and the thinner can be improved by partially changing the inside diameter of the junction pipe 75 according to the type of a solution which passes the pipe, properly depending on the viscosity and flow rate of each of solutions such as the resist solution and the thinner which pass the pipe.

Figure 11:
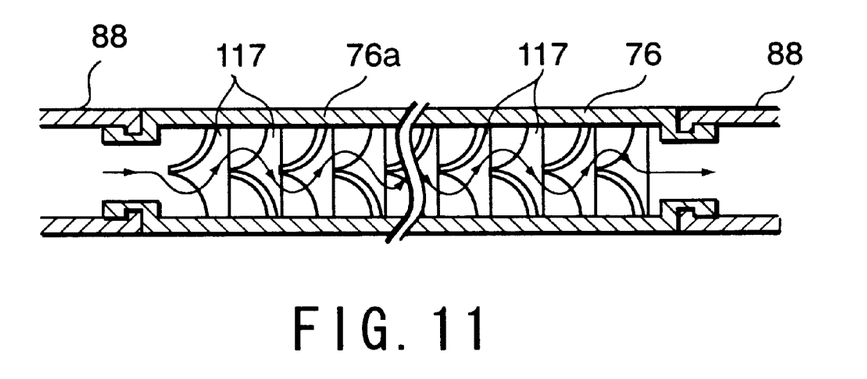
FIG. 11 is a sectional view showing the structure of a static mixer in FIG. 6.
Figure 12A:
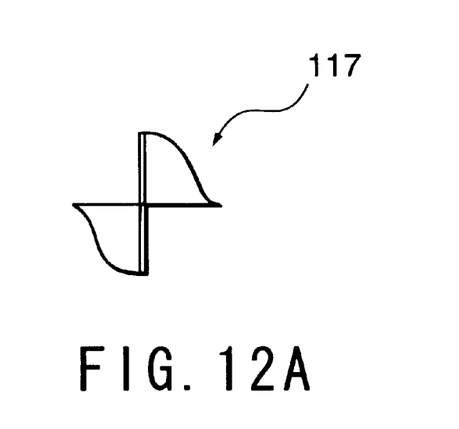
FIG. 12A and FIG. 12B are front views each showing a baffle plate in the static mixer in FIG. 11.
Figure 12B:
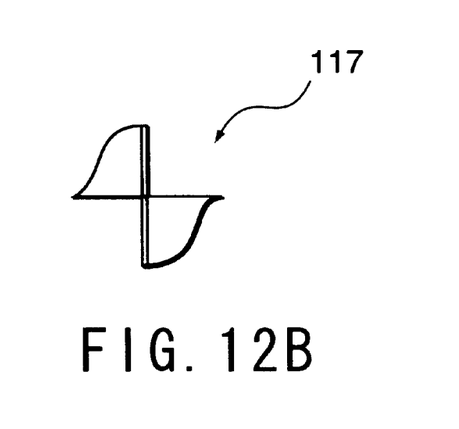

As shown in FIG. 11, the static mixer 76 is structured by arranging a plurality of, for example, 74 baffle plates in multiple stages in a cylindrical pipe 76a, for example, made of SUS. As shown in FIG. 12, each baffle plate 117 is formed by twisting one side of a square plate by 90 degrees to the right or the left. FIG. 12A shows a baffle plate twisted to the left, while FIG. 12B shows a baffle plate twisted to the right. In the pipe 76a of the static mixer 76, such baffle plates 117 twisted to the left and the right are arranged alternately. By the aforesaid arrangement of the baffle plates 117, the mixed solution of the resist solution and the thinner which is introduced into the static mixer 76 flows while changing its rotation direction from right to left and left to right alternately so as to be efficiently stirred and mixed, and then flows out.

It is preferable that the inside diameter of the cylindrical pipe 76a of the static mixer 76 be, for example, in the range of 2 mm to 8 mm which is equal to that of a tube for connection. If the inside diameter of the cylindrical pipe 76a is smaller than the aforesaid range, the possibility that the pipe is clogged up increases. Contrary to this, if it is too much larger, the amount of the solution to be disposed of increases when the viscosity and type of the resist solution are changed, whereby the utilization efficiencies of the resist solution and the thinner lower. Incidentally, in this static mixer 76, the inner surface of the pipe and the surface of the baffle plate 117 with which the resist/thinner mixed solution is brought into contact are coated with a corrosion-resistant film such as a Teflon coating, a NIMUFLON plated film, a TiC film, a Tuframe treated film, a white ALMITE, or the like.

As shown in FIG. 4, the static mixer 76 is installed aslant so that the downstream side is higher than the upstream side. In the static mixer 76, many baffle plates 117 provided therein block the passage of air, which causes the occurrence of stagnant air. Such stagnant air causes a drop in the stirring capability of the resist solution and the thinner. For this reason, in this embodiment, the static mixer 76 is placed aslant or vertically so that the downstream side is higher, whereby air which enters the static mixer 76 moves to the downstream side by its own buoyancy and becomes easy to discharge from the mixed solution nozzle 86. As a result, the occurrence of stagnant air is prevented and a fixed stirring capability can be maintained. Incidentally, it can be confirmed that stagnant air does not occur if the angle of inclination of the static mixer 76 is 20° or more.

Figure 13:
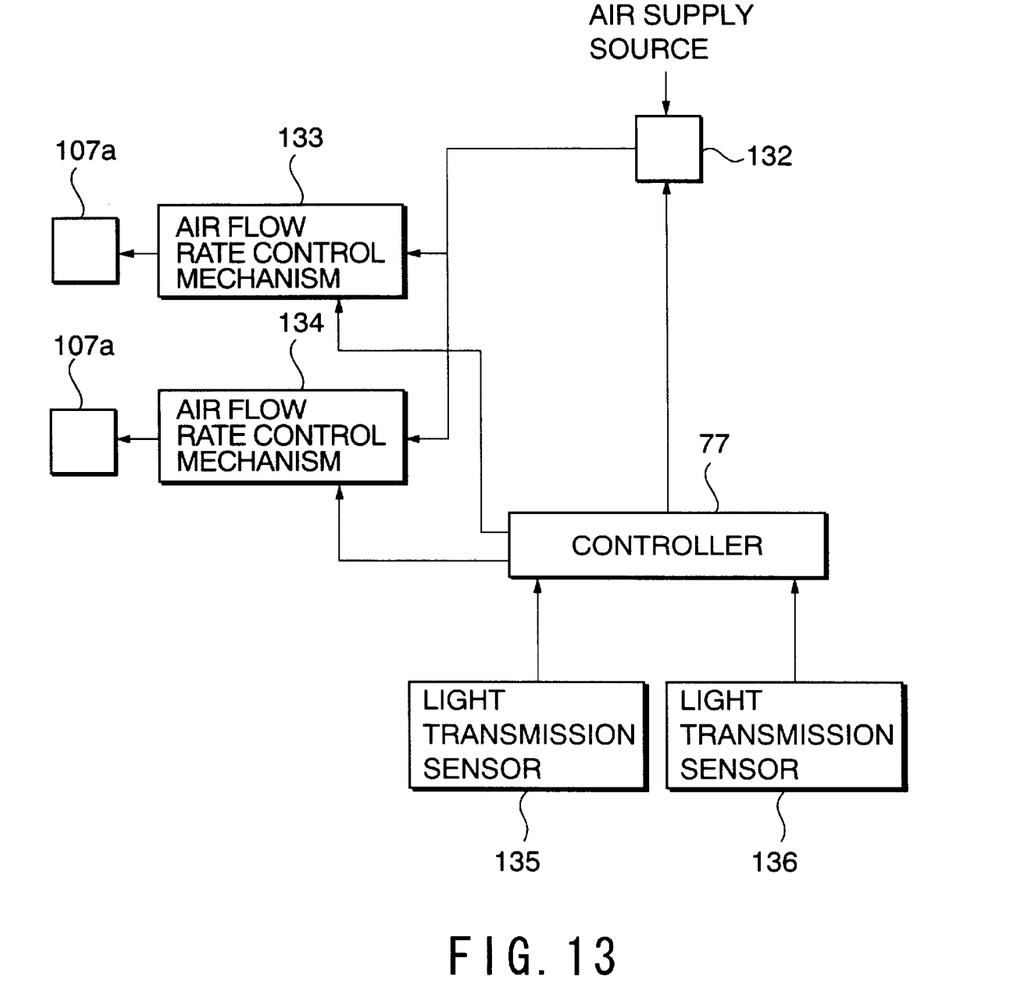
FIG. 13 is a block diagram showing the configuration of a control system of the resist/thinner mixer in the embodiment.

Next, the configuration of a control system of this resist/thinner mixer will be explained. FIG. 13 is a block diagram showing the configuration of the control system.

The controller 77 which is situated downstream of the static mixer 76 controls the discharge amounts of the resist solution and the thinner to be discharged from the bellows pumps 73 and 74 according to a desired concentration of the mixed solution, and also measures the concentration of the mixed solution supplied to the mixed solution supply nozzle 86 and controls the discharge amounts of the resist solution and thinner to be discharged from the bellows pumps 73 and 74 based on the measurement. As shown in FIG. 13, the controller 77 controls the respective bellows pumps 73 and 74 by controlling an electromagnetic valve for opening and closing a main air valve 132 which is connected to an air supply source. Namely, air cylinders which drive the bellows pumps 73 and 74 respectively are connected to the air supply source via the main air valve 132, and the bellows pumps 73 and 74 are driven integrally by on-off control of air supply to the respective air cylinders.

Moreover, the controller 77 has the function of giving signals indicating controlled variables according to setting made by an operator to two air flow rate control mechanisms 133 and 134 which are provided corresponding to the bellows pumps 73 and 74. Since the discharge amounts per unit hour of the bellows pumps 73 and 74 are determined by stroke speeds of rods in a resist bellows pump air cylinder 107a and a solvent bellows pump air cylinder 107b, the discharge amounts per unit hour of the bellows pumps 73 and 74 can be controlled by increasing or decreasing air flow rates to be supplied to the air cylinders 107a and 107b from the air supply source. The aforesaid control of the discharge amounts per unit hour of the bellows pumps 73 and 74 makes it possible to freely set the mixing ratio of the resist solution to the thinner, and hence the viscosity of the resist solution to be supplied to the wafer W can be selected. When the concentration of the mixed solution is measured by the sensor 99 and the concentration of the mixed solution is stabilized, the mixed solution is applied to the surface of the wafer W. Incidentally, the concentration of the mixed solution is measured by measuring the electric capacity of the solution.

Moreover, the controller 77 performs such control that the main air valve 132 is closed and the air cylinders 107a and 107b are switched to an OFF-state based on a first inputted detection signal out of outputs from each of two light transmission sensors 135 and 136 which detect end points of discharge processes of the respective bellow pumps 73 and 74.

Next, the operation of the aforesaid resist/thinner mixer will be explained.

The operator previously gives data for setting the viscosity of the resist solution to be supplied to the wafer W to the controller 77. If a correspondence table of the viscosity of the resist solution and the stroke speeds (discharge amounts per unit hour) of the bellows pumps 73 and 74 is provided in the controller 77, for example, the viscosity can be set by directly inputting numeric data which indicate a viscosity desired by the operator. The supply amount of the resist/thinner mixed solution in each cycle can be set artificially by regulating movable ranges of the pistons in the air cylinders 107a and 107b for driving the bellows pumps 73 and 74 by means of the limiters or can be set automatically by control by means of the controller.

When the controller 77 gets the data for setting the viscosity of the resist solution from the operator, for example, the controller 77 reads out data on the corresponding stroke speeds of the bellows pumps 73 and 74 from the correspondence table and give signals indicating controlled variables corresponding to desired stroke speeds to the two air flow rate control mechanisms 133 and 134 for controlling the driving of the air cylinders 107a and 107b of the bellows pumps 73 and 74. Thus, stroke speeds, that is, discharge amounts per unit hour of the respective bellows pumps 73 and 74 are set in order to obtain a desired viscosity of the resist solution.

After the completion of the aforesaid setting, the controller 77 actuates the electromagnetic valve so that the main air valve 132 is opened. By opening the main air valve 132, air is supplied to the air cylinders 107a and 107b of the bellows pumps 73 and 74 from the air supply source. Thereby, the resist solution and the thinner, which are sucked up into the bellows pumps 73 and 74 from the resist tank 71 and the thinner tank 72 respectively, join in the junction pipe 75, and they are mixed and introduced into the static mixer 76. The mixed solution is stirred and mixed in this static mixer 76 and passes through the mixed solution supply pipe 88. The concentration of the mixed solution passing through the mixed solution supply pipe 88 is measured by the sensor 99, and when the controller 77 judges that the measured concentration is a desired value, the mixed solution is discharged to the surface of the wafer W from the mixed solution nozzle 86. Meanwhile, when it is judged that a value measured by the sensor 99 is not the desired value, the discharge amounts of the resist solution and the thinner are controlled based on the measured value by the controller 77 in order to obtain a desired concentration. The mixed solution nozzle 86 stands by at the mixed solution nozzle waiting position 90, and the mixed solution is discharged until its concentration reaches the desired concentration. When its concentration reaches the desired concentration, the mixed solution nozzle 86 moves to a position above the wafer W and discharges the mixed solution to the surface of the wafer W.

When the light transmission sensor 135 or 136 detects the arrival of either of the bellows pumps 73 and 74 at the end point of the discharge process, the controller 77 actuates the electromagnetic valve to close the main air valve 132. By closing the main air valve 132, the compression (discharge) operation of each of the bellows pumps 73 and 74 is completed, and the process then advances to the extension (suction) process by elasticity restoring force of the flexible tube 102. Thus, the supply of the resist solution to the wafer W is completed.

As described above, according to this embodiment, it is possible to prepare the resist solution with a desired viscosity by stirring and mixing the resist solution and the thinner in a desired ratio and supply it to the wafer W at the time of the supply of the resist to the wafer W. Further, the controller can measure the concentration of the mixed solution and control the discharge amounts of the resist solution and the thinner so that the desired concentration can be obtained, whereby the mixed solution with a precise concentration can be supplied to the wafer W and a coating film with a desired thickness can be obtained efficiently. Furthermore, the resist solution and the thinner are previously mixed in the junction pipe before mixing by the static mixer 76, whereby the length of the static mixer 76 can be shortened, and consequently the entire unit can be downsized. Moreover, the resist solution and the thinner are mixed adequately, whereby the thickness of a coating film applied on the wafer W is made uniform within the surface of the wafer W.

Although the structure of supply of the resist solution and the thinner is explained with the resist coating unit (COT) as the example thereof in the aforesaid embodiment, this structure can be applied to the developing unit (DEV), for example. A developing solution/water mixer in the developing unit (DEV) will be explained below by means of FIG. 8. This mixer has almost the same structure as the resist/thinner mixer in the resist coating unit (COT), but differs therefrom only in the type of solutions stored in tanks and the use of mass-flow controllers in place of the bellows pumps.

In the developing unit (DEV), a developing solution is used as a processing solution, and water is used as a solvent.

Figure 8:
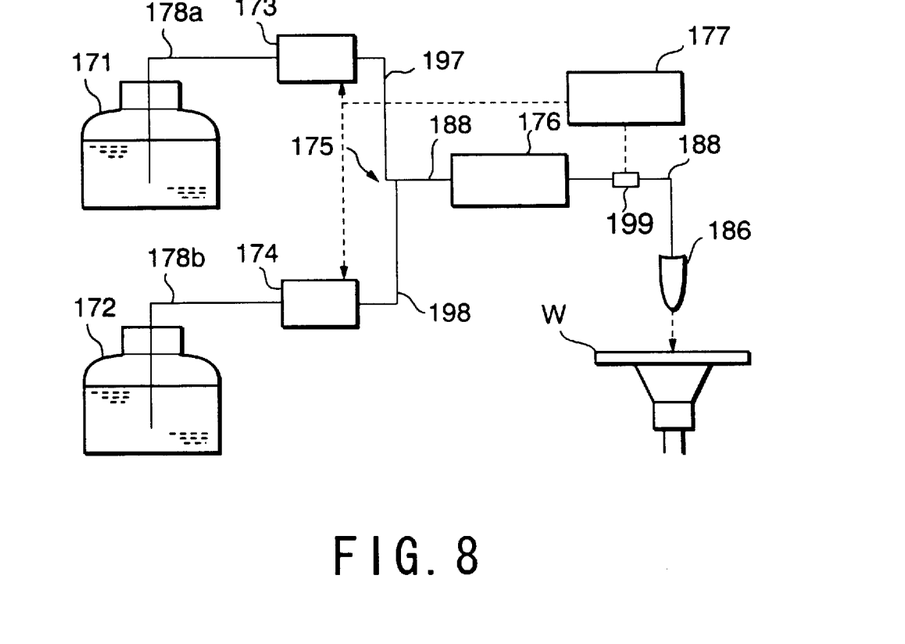
FIG. 8 is a diagram showing the structure of a developing solution/water mixer in a developing processing unit.

As shown in FIG. 8, the developing solution/water mixer includes a developing solution tank 171 for storing a developing solution, a water tank 172 for storing water, a mixed solution supply pipe 88 for supplying a mixed solution of the developing solution and the water to a mixed solution nozzle 186, a developing solution supply pipe 197 for supplying the developing solution to the mixed solution supply pipe 188, a water supply pipe 198 for supplying the water to the mixed solution supply pipe 188, a junction pipe 175, which is located at the junction of the developing solution supply pipe 197 and the water supply pipe 198, for mixing the developing solution and the water and supplying this mixed solution to the mixed solution supply pipe 188, a developing solution mass-flow controller 173, for example, as a flow rate controller for controlling the amount of the developing solution to be taken out of the developing solution tank 171 and introducing the developing solution into the developing solution supply pipe 197, a water mass-flow controller 174, for example, as a flow rate controller for controlling the amount of the water to be taken out of the water tank 172 and introducing the water into the water supply pipe 198, a static mixer 176 as a mixer for stirring and mixing again the mixed solution of the developing solution and the water which has passed the junction pipe 175. It further includes a sensor 199 which measures the concentration of the mixed solution passing the mixed solution supply pipe 188, and a controller 177 which performs such control that the concentration of the mixed solution reaches a predetermined concentration. The mass-flow controllers 173 and 174 are flow rate controllers which automatically supply the developing solution and the water.

Thanks to such a structure, on the occasion of the supply of the developing solution to the wafer W, it is possible to stir and mix the developing solution and the water in a desired ratio to make a developing solution with a desired concentration and supply it to the wafer W. Further, it is possible for the controller to measure the concentration of the mixed solution and control the discharge amounts of the developing solution and the water so as to obtain a desired concentration, whereby the mixed solution with a precise concentration can be supplied to the wafer W. Furthermore, since the developing solution and the water are previously mixed in the junction pipe before mixing by the static mixer 176, the length of the static mixer 176 can be shortened, and consequently the entire unit can be downsized. Moreover, the developing solution and the water are mixed adequately, which enables the uniform supply of the developing solution onto the wafer W. Consequently, uniform developing processing within the surface of the wafer W can be performed, and unevenness of developing does not occur.

Although the mass-flow controllers are used in this case, the bellows pumps can be used instead, and also mass-flow controllers can be used instead of the bellows pumps in the aforesaid resist coating unit (COT).

Figure 9:
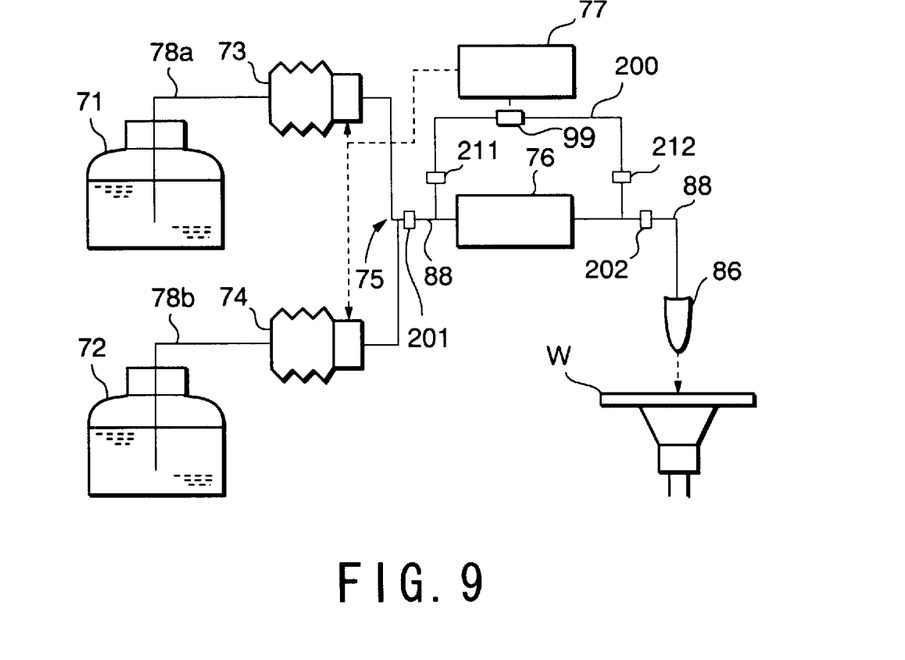
FIG. 9 is a diagram showing the structure of another resist/thinner mixer.

If it takes a lot of time to stabilize measurement in the measurement of the concentration of the mixed solution by the sensor 99 in the aforesaid embodiment, a circulation pipe 200 for circulating the mixed solution may be provided as shown in FIG. 9. FIG. 9 shows a structure in which the circulation pipe 200 is added to the structure shown in FIG. 6, and with this addition, the positions of the sensor 99 and the controller 77 differ from those in FIG. 6. As shown in FIG. 9, the circulation pipe 200 may be provided so that the mixed solution flowing between the mixed solution supply nozzle 86 and the junction pipe 75 is circulated through a course different from the mixed solution supply pipe 88 located with the static mixer 76 therebetween. Moreover, valves 201 and 202 are provided in the mixed solution supply pipe 88 so that the circulation pipe 200 is sandwiched between them. The sensor 99 is set so as to measure the concentration of the mixed solution flowing through the circulation pipe 200. In addition, valves 211 and 212 are provided at both ends of the circulation pipe 200 with the sensor 99 and the controller 77 therebetween.

Operation in the case where the aforesaid circulation pipe 200 is further provided will be explained in brief. When the resist solution and the thinner are discharged from the respective tanks, the valves 211 and 212 provided in the circulation pipe 200 are closed. The valve 201 in the mixed solution supply pipe 88 is opened, and the valve 202 therein is closed. Predetermined discharge amounts of the resist solution and the thinner are supplied into the mixed solution supply pipe 88 through the junction pipe 75, and after the mixed solution mixed in the junction pipe 75 passes through the static mixer 76, the valve 212 in the circulation pipe 200 is opened. After a lapse of several minutes, the valve 201 is closed, the valve 211 is opened, and the discharge of the solutions from the tanks are stopped. Thus, the mixed solution transferred into the circulation pipe 200 is flowed out again into the mixed solution supply pipe 88 which is provided before the static mixer 76. This mixed solution flowed out passes through the static mixer 76 again, flows through the mixed solution supply pipe 88 and the circulation pipe 200, and hence circulates through the pipes limited by the valves 201 and 202. In such a structure, the mixed solution circulates through the pipes in a predetermined region, and the concentration of this circulating mixed solution is measured. Accordingly, when it takes a lot of time to stabilize the measurement of concentration by the sensor 99, the mixed solution can be measured without being disposed of as a waste solution, resulting in a sharp reduction in the cost of materials.

Next, another example of a pump suitable for the present invention will be explained.

Figure 14:
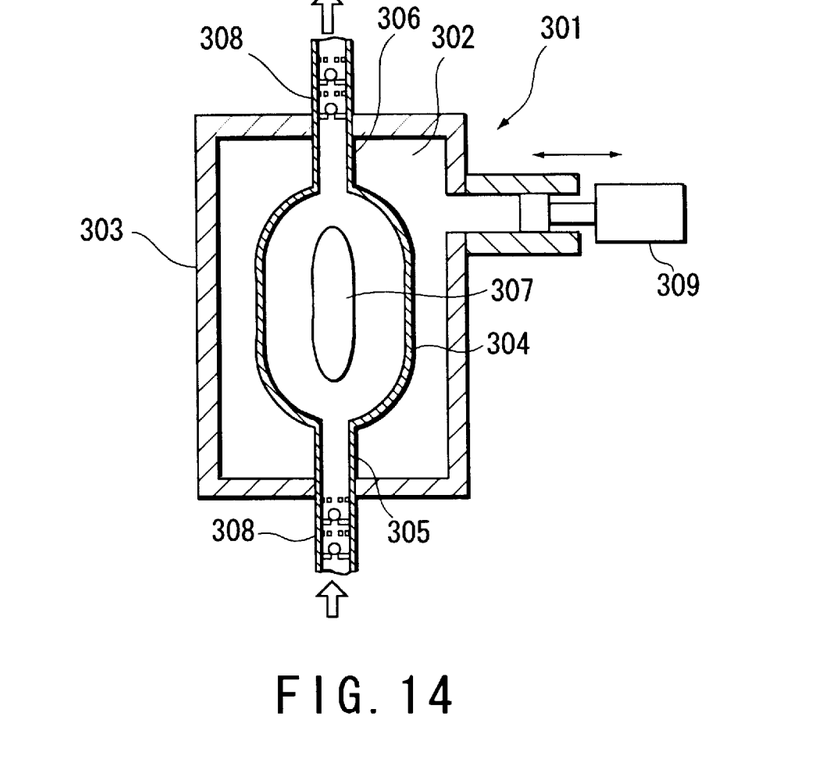
FIG. 14 is a diagram showing the structure of a pump according to another embodiment of the present invention.

FIG. 14 is a diagram showing the structure of a pump 301. The pump 301 is used, for example, in place of the bellows pumps 73 and 74 in the aforesaid embodiment.

As shown in FIG. 14, in the pump 301, a contractible diaphragm 304 is housed in a container 303 filled with a secondary medium 302, for example, made of silicon oil. Pipes 305 and 306 are connected respectively to the suction side and the discharge side of the diaphragm 304, and a rigid body 307 made of PTFE or silicon is housed in the diaphragm 304. Two check valves 308 are mounted in each of the pipes 305 and 306. A cylinder 309 is directly connected to the container 303. The diaphragm 304 contracts via the secondary medium 302 with the operation of the cylinder 309, whereby the solution can be supplied. In the pump 301 thus structured, a pressure loss can be reduced greatly compared with a bellows pump.

Figure 15:
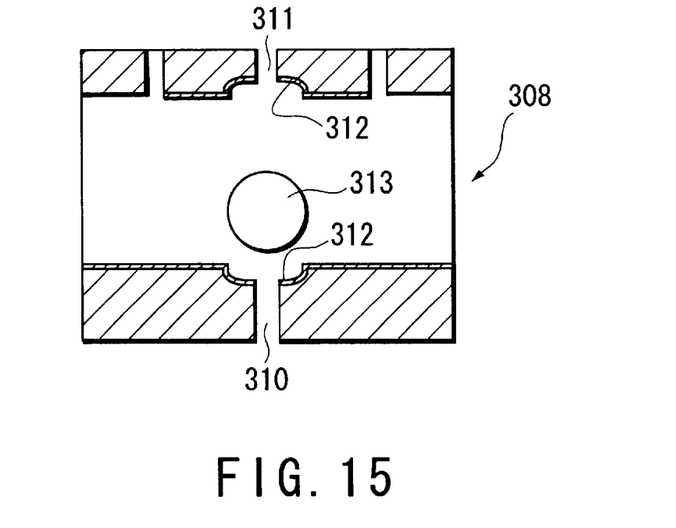
FIG. 15 is a diagram showing the structure of a check valve according to the aforesaid another embodiment.

FIG. 15 is a diagram showing an example of the check valve 308 in the aforesaid pump 301.

In this check valve 308, a sheet member 312 made of sapphire, ruby, or the like is stuck at least on the surface of each of a suction port 310 and a discharge port 311 of the pump. A sphere 313 has, for example, a diameter of about 3 mm to 4 mm, and the sphere 313 is also made of sapphire, ruby, or the like. The use of these materials enables precise working, for example, precise working of a spherical surface, leading to further reduction in pressure loss.

Although the example in which the present invention is applied to the unit for coating the semiconductor wafer with the resist solution is explained in the aforesaid embodiments, the present invention can be applied to a unit for coating substrates other than the semiconductor wafer, for example, an LCD substrate with the resist solution.

Further, although the unit for coating the substrate to be processed with the resist solution or the developing solution as the processing solution is explained, the present invention can be applied to any coating unit which uses any solvent and processing solution if the coating unit is to coat the substrate to be processed with any other processing solution and supply a solvent before the coating of the processing solution in order to enhance wettability of the substrate to be processed.

Furthermore, the coating unit having the structure in which the processing solution is applied to the surface of the semiconductor wafer while the semiconductor wafer is rotated is explained in the aforesaid embodiments, the present invention can be applied to a coating unit having a structure in which the processing solution is applied to the surface of the semiconductor wafer without rotating the semiconductor wafer.

As explained above, according to the present invention, the inside diameter of the junction pipe is set to be smaller than the inside diameters of the other pipes, whereby the processing solution and the solvent can be mixed efficiently in the junction pipe. As a result, the mixed solution of the processing solution and the solvent to be supplied onto the substrate is mixed sufficiently, and hence the substrate is coated with the mixed solution so that a uniform film thickness can be obtained within the surface of the substrate.

The disclosure of Japanese Patent Application No. 2000-97016 filed Mar. 31, 2000 including specification, drawings and claims are herein incorporated by reference in its entirety.

Although only some exemplary embodiments of this invention have been described in detail above, those skilled in the art will readily appreciated that many modifications are possible in the exemplary embodiments without materially departing from the novel teachings and advantages of this invention. Accordingly, all such modifications are intended to be included within the scope of this invention.

What is claimed is:

1. A mixing apparatus, comprising;
  a first pipe having a first inside diameter, for discharging a mixed solution of a processing solution and a solvent;
  a second pipe having a second inside diameter, for supplying the processing solution to the first pipe;
  a third pipe having a third inside diameter, for supplying the solvent to the first pipe;
  a fourth pipe which has a fourth inside diameter smaller than all of the first inside diameter, the second inside diameter, and the third inside diameter, which is connected to the first pipe, the second pipe, and the third pipe, to which the processing solution and the solvent are supplied, and which supplies the mixed solution of the processing solution and the solvent to the first pipe;
  a fifth pipe, one end of which is connected to a first position in the first pipe and the other end of which is connected to a second position in the first pipe;
  a controller for performing such control that the mixed solution circulates in the first pipe between the first position and the second position and in the fifth pipe; and
  a measuring unit for measuring a concentration of the mixed solution in the fifth pipe.

2. The apparatus as set forth in claim 1, wherein the second pipe, the fourth pipe, and the first pipe are connected in a straight line.

3. The apparatus as set forth in claim 1, wherein the first inside diameter, the second inside diameter, and the third inside diameter are almost the same.

4. The apparatus as set forth in claim 1, wherein the fourth inside diameter is about 0.2 mm to about 0.5 mm.

5. A coating apparatus, comprising:
  a holder for holding a substrate;
  a nozzle for supplying a mixed solution of a processing solution and a solvent to a surface of the substrate;
  a first pipe having a first inside diameter, for supplying the mixed solution to the nozzle;
  a second pipe having a second inside diameter, for supplying the processing solution to the first pipe;
  a third pipe having a third inside diameter, for supplying the solvent to the first pipe;
  a fourth pipe which has a fourth inside diameter smaller than all of the first inside diameter, the second inside diameter, and the third inside diameter, which is connected to the first pipe, the second pipe, and the third pipe, to which the processing solution and the solvent are supplied, and which supplies the mixed solution of the processing solution and the solvent to the first pipe;
  a fifth pipe, one end of which is connected to a first position in the first pipe and the other end of which is connected to a second position in the first pipe;
  a controller for performing such control that the mixed solution circulates in the first pipe between the first position and the second position and in the fifth pipe; and
  a measuring unit for measuring a concentration of the mixed solution in the fifth pipe.

6. The apparatus as set forth in claim 5, further comprising:
  a mixer for further mixing the mixed solution mixed in the fourth pipe disposed midway in first pipe,
  wherein the first position and the second position are set so that the mixer is sandwiched between them.

7. The apparatus as set forth in claim 5, wherein the second pipe, the fourth pipe, and the first pipe are connected in a straight line.

8. The apparatus as set forth in claim 5, wherein the first inside diameter, the second inside diameter, and the third inside diameter are almost the same.

9. The apparatus as set forth in claim 5, wherein the fourth inside diameter is about 0.2 mm to about 0.5 mm.

10. The apparatus as set forth in claim 5, further comprising a mixer for further mixing the mixed solution mixed in the fourth pipe.

11. The apparatus as set forth in claim 5, wherein the processing solution is a resist solution, and wherein the solvent is a thinner.

* * * * *